United States Patent [19]

Seo

[11] Patent Number: 5,514,260
[45] Date of Patent: May 7, 1996

[54] APPARATUS FOR SIMULTANEOUS PLATING

[75] Inventor: O. Gweon Seo, Seoul, Rep. of Korea

[73] Assignee: Samsung Electronics Co., Ltd., Suwon, Rep. of Korea

[21] Appl. No.: 391,601

[22] Filed: Feb. 21, 1995

[51] Int. Cl.[6] .......................... C23C 14/34; C23C 14/32
[52] U.S. Cl. .................. 204/298.26; 204/298.05; 204/298.25; 204/298.41
[58] Field of Search ............... 204/298.05, 298.25, 204/298.26, 298.41

[56] References Cited

U.S. PATENT DOCUMENTS

| | | | |
|---|---|---|---|
| 4,867,859 | 9/1989 | Harada et al. | 204/298 |
| 4,877,505 | 10/1989 | Bergmann | 204/192.38 |
| 4,992,153 | 2/1991 | Bergmann et al. | 204/192.16 |
| 5,234,561 | 8/1993 | Randhawa et al. | 204/192.38 |
| 5,413,684 | 5/1995 | Bergmann | 204/192.13 |
| 5,427,671 | 6/1995 | Ahmed | 204/298.23 |
| 5,454,919 | 10/1995 | Hill et al. | 204/192.11 |

FOREIGN PATENT DOCUMENTS 2-34775  2/1990  Japan ................. 204/298.26

*Primary Examiner*—Aaron Weisstuch
*Attorney, Agent, or Firm*—Cushman Darby & Cushman

[57] ABSTRACT

The present invention relates to an apparatus for simultaneous plating with which arc ion plating and hollow cathode discharge (HCD) ion plating can be concurrently carried out in one chamber, and sputtering plating can also be performed in the other chamber while the former two types of platings are being performed. Since only one type of plating can be performed in one chamber with a conventional apparatus, there have been problems such as excessive installation cost and inferior plating quality. According to the present invention, simultaneous arc ion plating and HCD ion plating in one chamber and sputtering plating in the other one is possible, which may lower the installation cost and improve the plating quality.

2 Claims, 6 Drawing Sheets

APPARATUS FOR SIMULTANEOUS PLATING

BACKGROUND OF THE INVENTION

The present invention relates to an apparatus for simultaneous plating, and more particularly to an apparatus with which arc ion plating, HCD(hollow cathode discharge) ion plating, and sputtering plating can be performed simultaneously. In general, vacuum deposition is divided into physical vapor deposition (PVD) and chemical vapor deposition (CVD). The physical vapor deposition may also be divided into evaporation, ion plating, and sputtering.

In more detail, the ion plating may be divided further into arc ion plating, hollow cathode discharge (HCD) ion plating, and multi-cathode ion plating. These different kinds of ion plating can be used for various purposes, and the merits and demerits of the above ion platings are also different from each other. According to the conventional vacuum plating apparatuses, only one type of plating can be performed in one chamber. In other words, it is usual that arc ion plating and HCD ion plating are performed in different chambers. Consequently, a seperate apparatus for each different kind of plating must be provided making the installation cost of such apparatus relatively high. Further, it is difficult to improve the plating quality of such apparatus because of the problems relative to the plating method itself. For example, in the case of arc ion plating and HCD plating, the coated surface is not smooth and the bonding strength of the coated film is not satisfactory.

SUMMARY OF THE INVENTION

The object of the present invention is to provide an apparatus with which simultaneous performing of different types of platings are possible. Another object of the present invention is to provide an apparatus with which arc ion plating and hollow cathode discharge (HCD) ion plating can be performed simultaneously in one of two chambers therein.

Still another object of the present invention is to provide an apparatus for simultaneous plating in the second chamber of which sputtering plating is performed simultaneously while other types of platings are being performed in the first chamber.

Further object of the present invention is to provide an ion plating apparatus which produces a coated film of excellent adhesive quality by installing an ion beam source.

To accomplish the above and other objects of the present invention, the apparatus according to the present invention is provided with two chambers, and a vacuum pump and two throttle valves for common use of the pump by the two chambers, wherein are provided an arc source and an HCD source in a chamber for performing arc ion plating and HCD ion plating at the same time, and a sputtering plating device in another chamber in which sputtering may be performed simultaneously with the plating operations in the first chamber.

The vacuum pump is shared by the first chamber, in which both of arc ion plating and hollow cathode discharge (HCD) ion plating are concurrently performed, and the second chamber in which sputtering plating is performed. Since the pressures required in the first chamber and the second chamber may be different, there are provided two throttle valves in a series of pipes connecting the two chambers.

In general, for vacuum evaporation, an object for plating is placed at an appropriate position in a plating chamber. A plating material is placed under the object for plating, and a heating device for evaporating the plating material is arranged under it. With the heating device, the plating material begins melting and then is evaporated. When the plating material is evaporated, its molecules escape from the material by molecular movement and approach the object for plating, resulting in an adhesive coat on it.

However, in the present invention, the plating material is placed on an arc ignitor for arc ion plating. The above object and the arc ignitor are placed in the upper part of the first chamber to allow for concurrent HCD ion plating in the same chamber. Thus, a device for HCD ion plating is mounted in the lower part of the chamber.

The arc ignitor produces an arc on the plating material at the first stage, and the arc is then continuously produced from the material itself. This means that the plating material itself acts as an arc source. With the arc, the plating material is instantaneously melted and ionized. The ionized particles of the plating material move into the inner space of the chamber, bombard the object for plating with a great impact and form a coated film on it.

The chamber is filled with inert gas and maintained under a pressure near a vacuum state of $10^{-2} \sim 10^{-3}$ torr. At this time, the temperature of the arc is about $4 \times 10^3 \sim 4 \times 10^4$ °K.

Also, a voltage of about 800~1,000 V is applied to the object for plating. The initial arc produced by the arc ignitor moves on the surface of the plating material at a speed of about 100 m/sec resulting in melting and ionizing of the plating material. In arc ion plating, the plating material is placed on the arc ignitor and therefore, a holder for the material is not necessary.

In HCD ion plating, a container for the plating material is mounted on the bottom of the first chamber and the object for plating is arranged in the lower part of the chamber. Consequently, arc ion plating and HCD ion plating can be concurrently performed.

The HCD source is mounted on the lower part of wall of the chamber so that thermoelectrons ejected from the source can collide with the object for plating.

The HCD source is made of a hollow tantalum rod inserted into a pipe with one open end. The space between the tantalum rod and the pipe is also filled with the same inert gas as that in the chamber, which is in a plasma state. This plasma state is separated and different from the other plasma state formed in the chamber. When a voltage is applied to the cathodic tantalum rod, the tantalum rod reacts with the inert gas in the plasma state. As Argon ions($Ar^+$) in the plasma state collide with the tantalum rod, the temperature of the rod becomes over 2,000° C. and the rod radiates thermoelectrons. The flow of those thermoelectrons is then deflected toward the plating material in the container and consequently the thermoelectrons collide with the plating material and melt it.

When the plating material is melted, atoms evaporate and escape from the plating material. To ensure that the atoms are ionized and adhere to the object for plating, the chamber should be maintained under the plasma state when the plating material is melted. The electrons in the plasma state collide with atoms from the plating material and the atoms are changed into ionized particles. The plating material thus becomes ionized, adheres to the above object and forms a coated film.

Here, the word plasma means ionized gas. There exist neutral gas, ions and electrons in the plasma, and the plasma is electrically neutral because the numbers of ions and electrons are nearly equal.

One plasma state is formed in the space between the tantalum rod and the pipe with inert gas, while the other one is formed under the object for plating with atoms from the plating material.

In the present invention, sputtering plating can be performed in the second chamber. The chamber is filled with inert gas and the pressure is maintained at about $10^{-4}$ torr. The pressure of the chamber for sputtering plating may also be maintained lower than that of the first chamber.

In the second chamber, the inert gas is in a plasma state as in the first chamber. A high voltage is applied to the plating material and atoms are separated for the material by a magnetron source. The separated atoms collide with the inert gas ions in the plasma state to thereby form another plasma region.

Next, a voltage is applied to the object for plating acting as a cathode, and the ions in the plasma state from the plating material adhere to the above object to form a coated film on it.

According to the present invention, arc ion plating and HCD ion plating thus can be concurrently carried out in one chamber, and sputtering plating can be also performed in the other one at the same time. To accomplish the above, only one pump is used, replacing the vacuum pumps of each chamber in the conventional apparatus, and two throttle valves are provided near the outlets of the chambers for keeping the chambers under the different pressure conditions as required.

The throttle valve plays an important role in maintaining the pressure of any chamber to a near vacuum state before the plating operation starts.

When the fluid is in a viscous flow state, the pressure of which is over $10^{-3}$ torr, the length of the pipe connected to the vacuum pump is an important variable to the quantity of exhaust gas. On the other hand, when the pressure of the chamber is below $10^{-3}$ torr, near to a high vacuum state as the result of continuous exhaust, i.e. in a molecular flow state, the diameter of the pipe is a more important variable than the length of the pipe. The throttle valves are thus provided to control the flow of the fluids in the chambers.

Further, according to the present invention, the molecular movement energy of the plating material ions is increased by the ion beam source. The bonding strength of the coated film is consequently improved.

BRIEF DESCRIPTION OF THE DRAWINGS

The above objects and the additional advantages of the present invention will become more apparent by describing in detail a preferred embodiment thereof with reference to the accompanying drawings in which.

DETAILED DESCRIPTION OF THE INVENTION

Hereinafter, the present invention will be described in detail with reference to the drawings.

Figure 1:
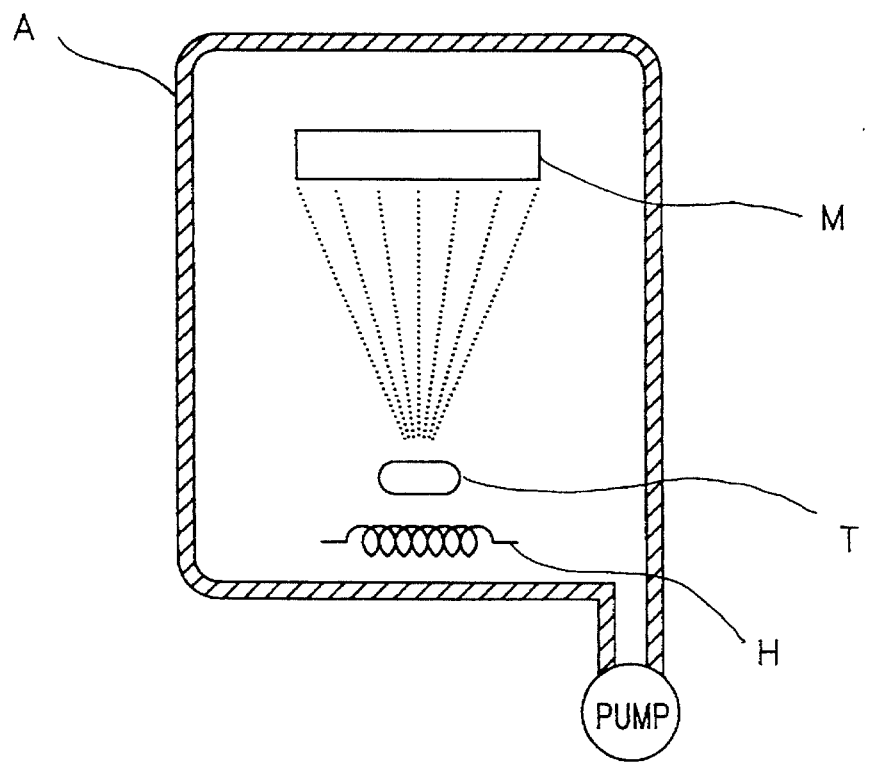
FIG. 1(a) is a sectional view showing an evaporation plating process.
FIG. 1(b) is a sectional view showing an arc ion plating process.
FIG. 1(c) is a sectional view showing a hollow cathode discharge (HCD)ion plating process.
FIG. 1(d) is a sectional view showing a sputtering plating process.
Figure 1:
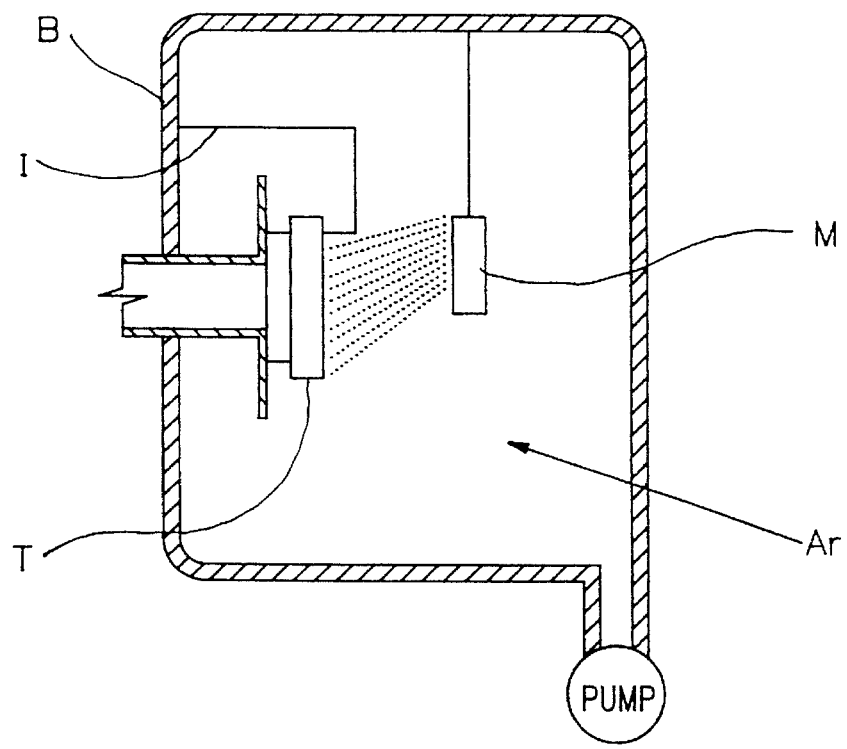
Figure 1:
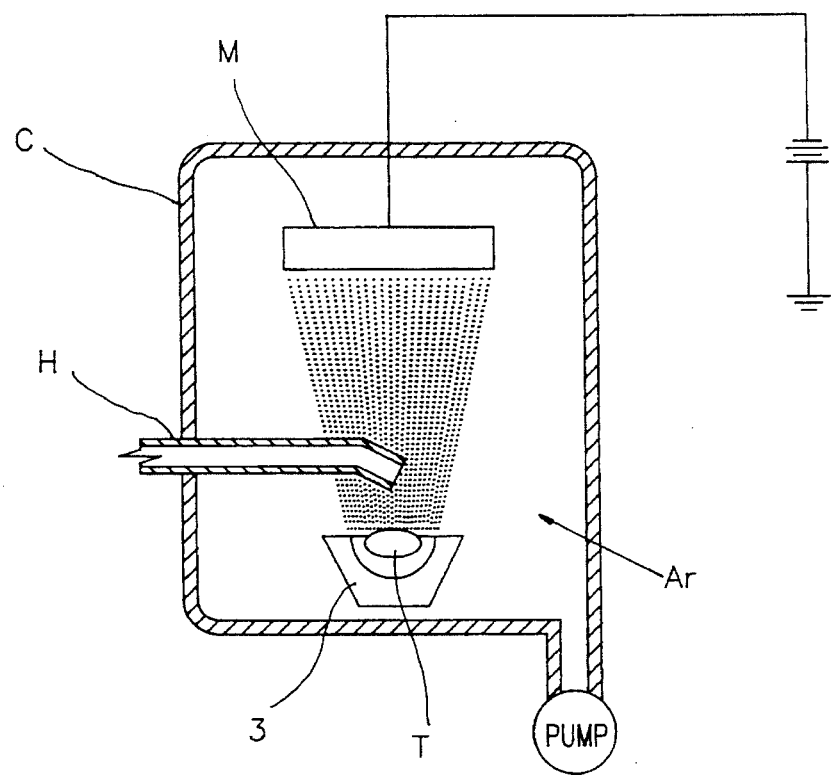
Figure 1:
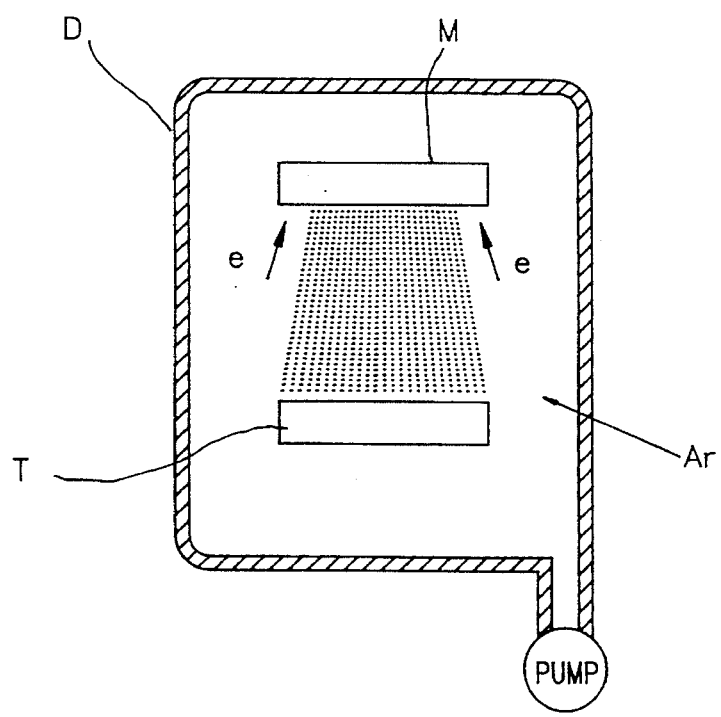

FIG.1(a) and FIG. 1(b) are sectional views showing vacuum evaporation and arc ion plating processes, respectively.

The object for Plating M is placed at an appropriate position in the plating chamber A or B. In the chamber A, a plating material T is located on a heating device H for vacuum evaporation. Also, in, the chamber B, another plating material T is mounted on an arc ignitor I for arc ion plating. The plating material T is melted and evaporated by the heating device H. Evaporated particles of the plating material T move into the inner space of the chamber A, adhere to the object M and form a coated film on the surface of the object.

The arc ignitor I in the chamber B produces a continuous arc on the plating material T.

With the arc, the plating material T is instantaneously melted and ionized. The ionized particles of the plating material move into the space in the chamber B, bombard the object M with a great impact and form a coated film on it.

At this time, the chamber B is filled with inert gas such as Argon gas and maintained in a vacuum state of $10^{-2}$~$10^{-3}$ torr and at a high temperature of about 450° C. A voltage of about 800~1,000 V is then applied to the object for plating M. The initial arc produced by the arc ignitor I moves on the surface of the plating material T at a speed of about 100 m/sec, causing the plating material T to be melt and ionized. Those ions adhere to and then form a coated film on the surface of the above object M.

FIG. 1(c) is a sectional view showing a hollow cathode discharge (HCD) ion plating process.

A container 3 for the plating material T is placed on the bottom of the chamber C and an object for plating M is arranged at an appropriate position in the upper part of the chamber. An HCD source H is installed on the lower end portion of the wall of the chamber C. The flow of thermoelectrons escaping from the HCD source H is deflected by a an applied magnetic field, resulting in collisions with the plating material T.

The plating material T is instantaneously melted by the thermoelectrons and changed to an atomic state. The atoms then escape from the plating material T and begin movement in the chamber C and ultimately towards the object M. These atoms are ionized by colliding with the thermoelectrons in the plasma state and form another plasma region under the object M, where the ions of the plating material T become anions. A voltage is applied to the object M as a cathode, and the ions of the plating material T in the plasma state then move and adhere to the above object M and form a coated film thereon.

FIG. 1(d) is a sectional view showing a sputtering plating process.

An object for plating M is placed in the upper part of the chamber D and a plating material T is located in the lower part therein. The chamber D is also filled with inert gas such as Ar gas and maintained in a plasma state. The pressure of the chamber D is maintained at about $10^{-4}$ torr, and the temperature is not so high as that of the above chambers A, B or C. The plating material T is also changed into an atomic state by the voltage applied to it.

The sputtered atoms from the plating material are changed to a plasma state in the space near the object for plating M, and the ions of the material T then adhere to the object M.

Figure 2:
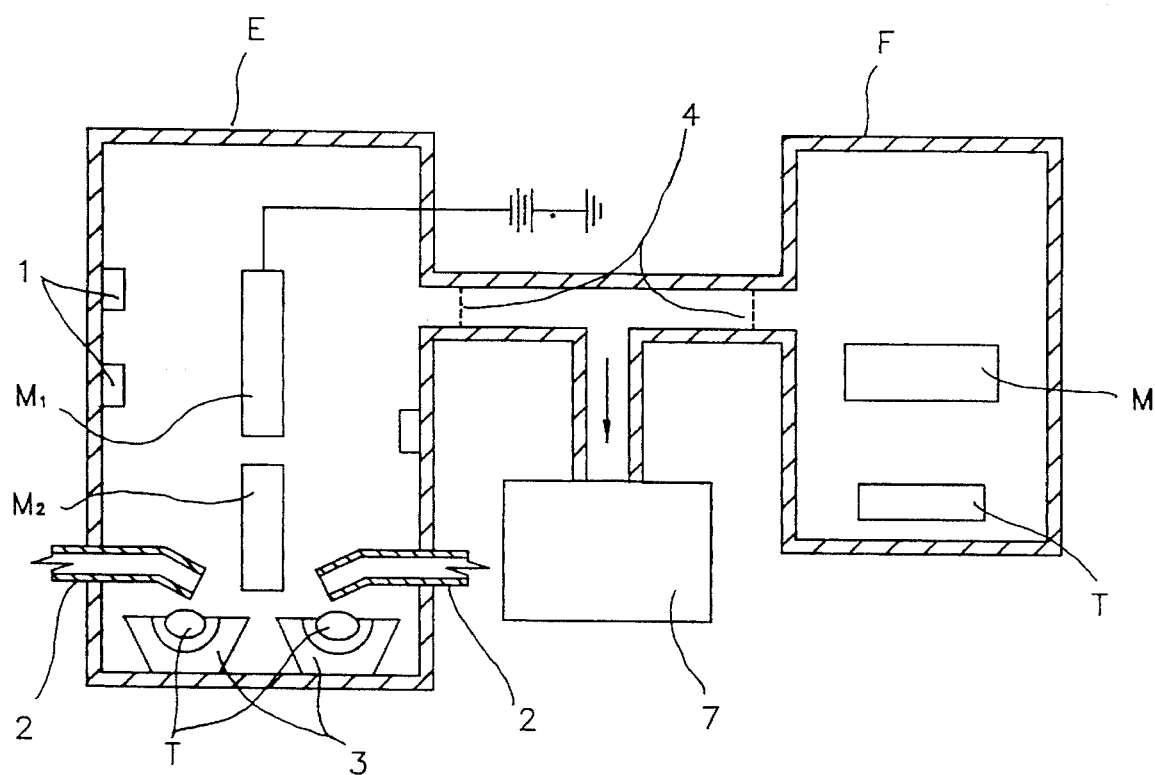
FIG. 2 is a sectional view showing the apparatus for simultaneous plating according to the present invention.

FIG. 2 is a sectional view showing the apparatus for simultaneous plating according to the present invention.

An arc source 1 and an HCD source 2 are respectively located in the upper and lower part of wall of the first chamber E. An object $M_1$ for arc ion plating is placed near the arc source 1, and an object $M_2$ for HCD ion plating is mounted thereunder. Containers 3 for plating material T are located on the bottom of the chamber E. As mentioned above a holder, for plating material is not necessary for arc ion plating.

The apparatus according to the present invention is thus designed so that arc ion plating may be performed in the upper part of the first chamber E and HCD ion plating may be concurrently performed in the lower part of the same chamber E.

The first chamber E and the second chamber F are provided with one vacuum pump 7 through pipes connected to two throttle valves therein. According to the present invention, the molecular flow in the pipe can be varied by controlling the two throttle valves 4 located adjacent to the corresponding outlets of the chambers, so as to maintain the two chambers under different and appropriate pressures.

There are provided two arc sources 1, two HCD sources 2 and two plating material containers 3 in the embodiment of the present invention. However, the number of arc sources 1, HCD sources 2, and containers 3 are not limited to those numbers as above in the present invention.

Figure 3:
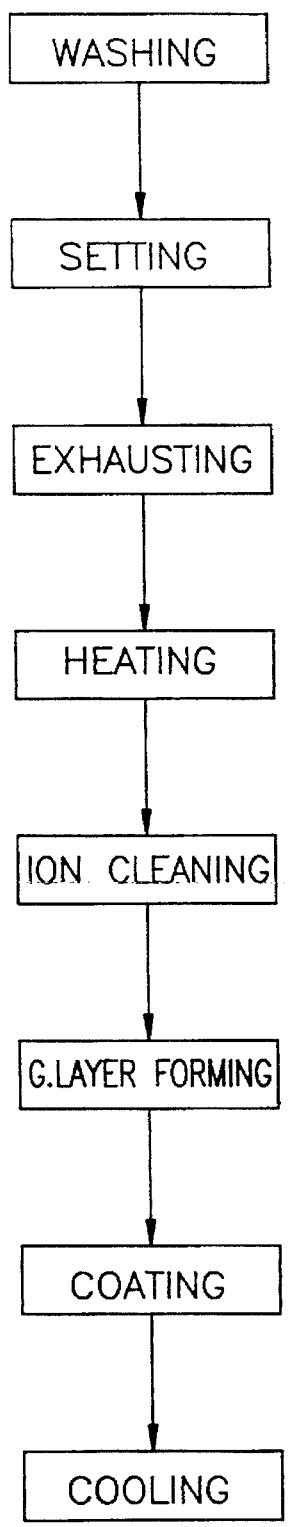
FIG. 3 is a block diagram illustrating the plating process by the apparatus for simultaneous plating according to the present invention.

FIG. 3 is a block diagram illustrating the plating process of the apparatus for simultaneous plating according to the present invention.

After cleaning the object for plating to wash off impurities, the objects for plating are placed in the first chamber and the second chamber. The unnecessary gas remaining in the two chambers is exhausted, resulting in removal of impurities, and the pressures of the chambers are maintained at about $5\times10^{-6}$ torr.

Oxides or other harmful materials on the above object are then removed by heating the object to a temperature of about 500° C. During this step, the exhaust is also carried out for the removal of the heated oxide particles anti other materials.

Next, plasma cleaning is performed by filling the chambers with an inert gas such as Ar gas. Plating is then performed by operation of the arc source, HCD source, or magnetron source. The thickness of plating may be desirably between about 3~5 μm. It is desirable to form a base layer on the object, for plating, so as to ensure strong adhesion of the plating material to the object. For example, in the case of titanium nitride plating, a preliminary plating using titanium as the plating material may be carried out for better adhesion.

With the apparatus according to the present invention, since arc ion plating and HCD plating are concurrently carried out in the same chamber and the base layer is firs fly formed, the coated surface is smooth and the bonding strength is excellent. After the plating process is completed, the coated object is finally cooled.

Figure 4:
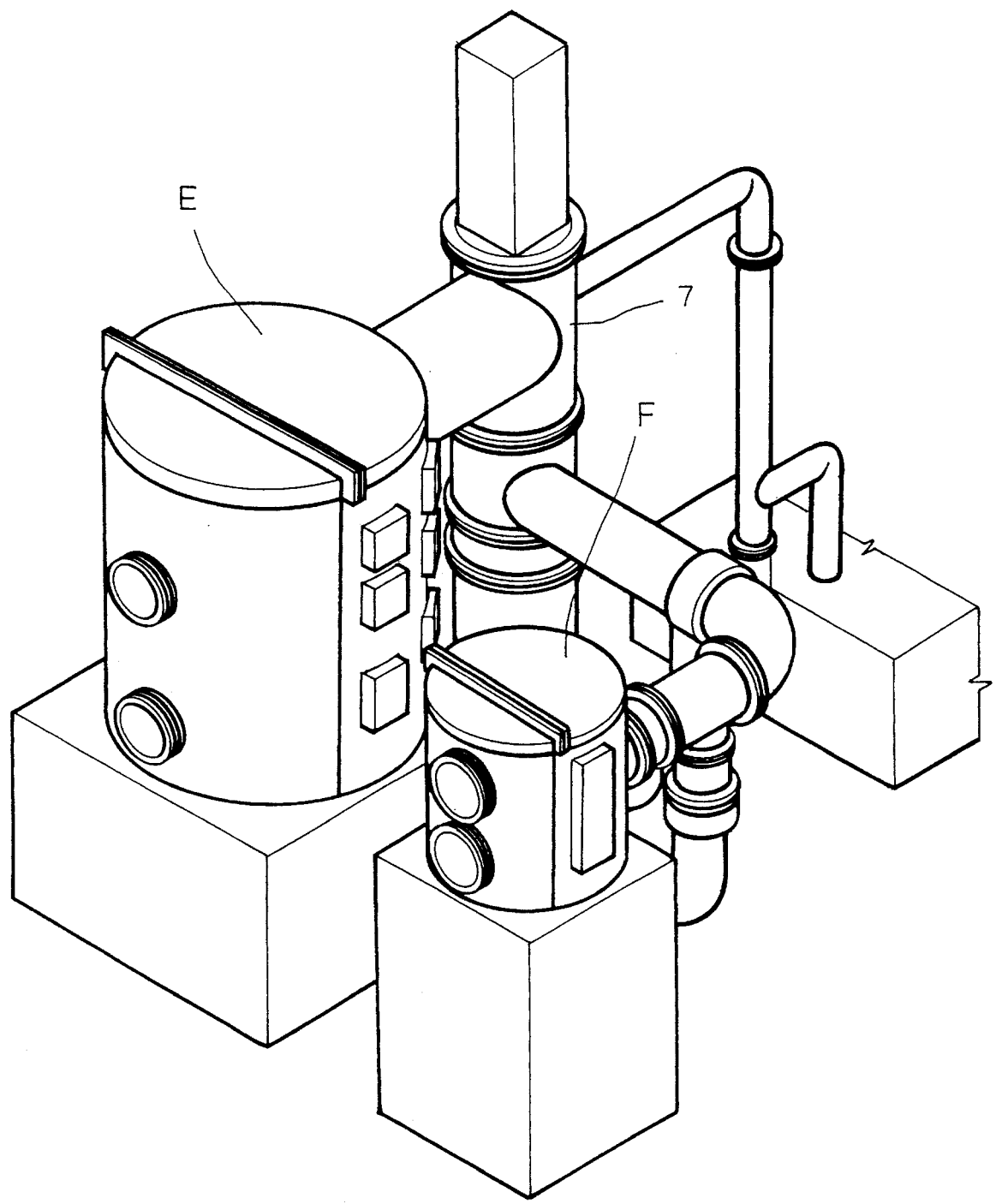
FIG. 4(a) is a perspective view of the apparatus for simultaneous plating according to the present invention.
FIG. 4(b) is a plan view of the apparatus for simultaneous plating according to the present invention.
FIG. 4(c) is a front view of the apparatus for simultaneous plating according to the present invention.
Figure 4:
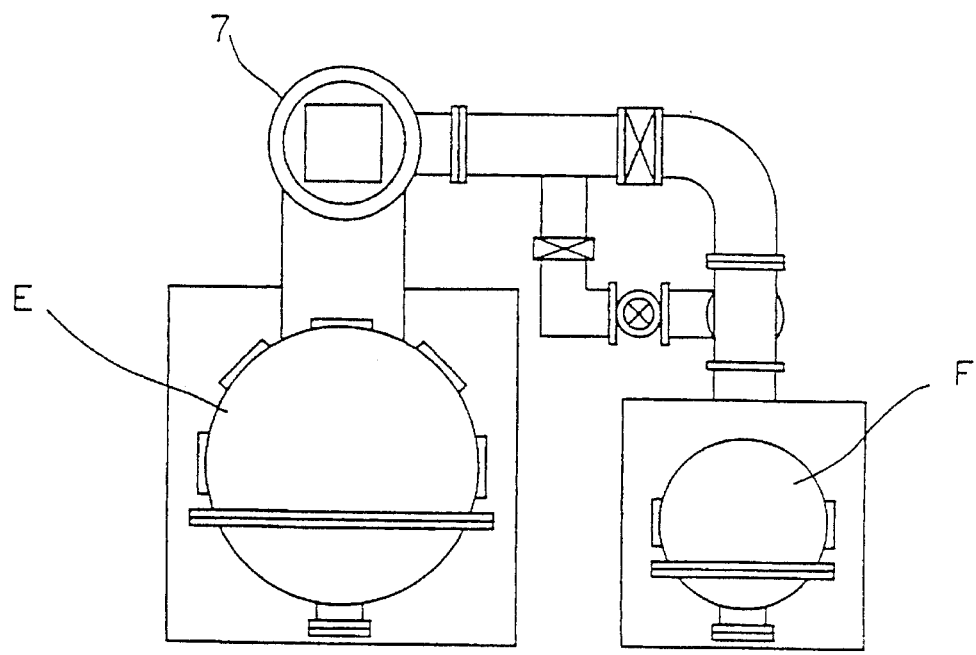
Figure 4:
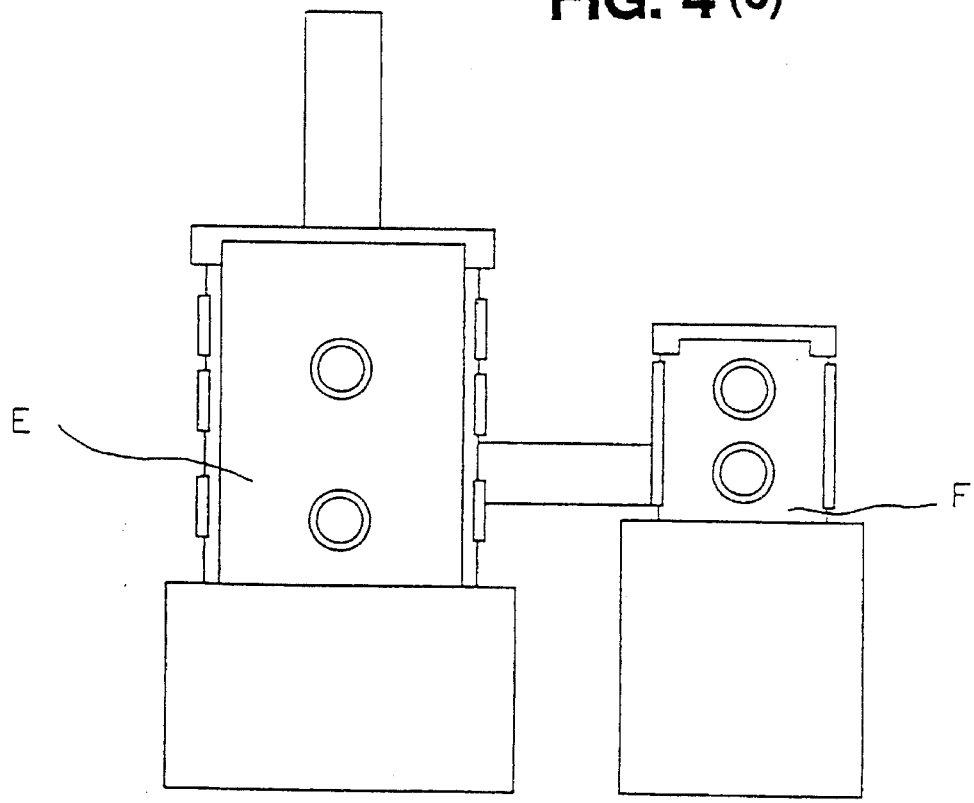

FIG. 4(a) is a perspective view showing the apparatus for simultaneous plating according to the present invention.

The apparatus according to the present invention has two view ports for each of the chambers. The entire of plating thus can be observed through those ports.

FIG. 4(b) is a plan, view of FIG. 4(a) showing the apparatus for simultaneous plating according to the present invention. And, FIG. 4(c) is a front view of FIG. 4(a) showing the apparatus for simultaneous plating according to the present invention.

Two throttle valves mounted near the outlets of the first and the second chambers are seen in the drawing.

According to the apparatus for simultaneous plating of the present invention, arc ion plating and hollow cathode discharge (HCD) ion plating may be concurrently performed in the first chamber, and sputtering plating can also be simultaneously carried out in the second chamber, while the former two types of platings are being performed in the first chamber. As a result, plating of excellent quality can be performed and the above mentioned problems of arc ion plating and HCD ion plating are thus solved.

Additionally, multi-layer plating can be easily performed with high productivity and a decrease in the cost of coated film formation.

Although the present invention has been described with respect to a preferred embodiment with reference to the accompanying drawings, the scope of the present invention shall not be limited by the specific embodiment herein, and variations and modifications may be readily made within the scope of the teachings of the present invention by one skilled in the art.

What is claimed is:

1. An apparatus for simultaneous plating comprising;

a first chamber in which arc ion plating and HCD ion plating may be concurrently or selectively performed;

a second chamber in which a sputtering plating may be performed;

a vacuum pump which is connected to said first and second chambers; and two throttle valves each of which is connected to one of said two chambers.

2. An apparatus for simultaneous plating as claimed in claim 1, wherein an arc source and an HCD source are respectively located in upper and lower parts of said first chamber, the plating material for HCD plating is placed in a container mounted on the bottom of the first chamber, and the plating material for arc ion plating is mounted directly on the arc ignitor without using a container.

* * * * *